United States Patent [19]

Deines et al.

[11] 4,180,439

[45] Dec. 25, 1979

[54] ANODIC ETCHING METHOD FOR THE DETECTION OF ELECTRICALLY ACTIVE DEFECTS IN SILICON

[75] Inventors: John L. Deines, Pleasant Valley; Michael R. Poponiak, Newburgh; Robert O. Schwenker, Hopewell Junction, all of N.Y.

[73] Assignee: International Business Machines Corporation, Armonk, N.Y.

[21] Appl. No.: 818,476

[22] Filed: Jul. 25, 1977

Related U.S. Application Data

[63] Continuation of Ser. No. 667,232, Mar. 15, 1976, abandoned.

[51] Int. Cl.$^2$ ............................................ G01N 27/46
[52] U.S. Cl. .................................... 204/1 T; 204/129.3
[58] Field of Search ................. 204/1 T, 129.3, 195 R

[56] References Cited

U.S. PATENT DOCUMENTS

| | | | |
|---|---|---|---|
| 3,303,109 | 2/1967 | Just | 204/1 T |
| 3,379,625 | 4/1968 | Csabi | 204/1 T |
| 3,536,600 | 10/1970 | Van Dijk et al. | 204/129.3 |
| 3,616,345 | 10/1971 | Van Dijk et al. | 204/129.3 |
| 3,640,806 | 2/1972 | Watanabe et al. | 148/187 |
| 3,660,250 | 5/1972 | Duffy et al. | 204/1 T |
| 3,713,922 | 1/1973 | Lepselter et al. | 204/129.3 |
| 3,846,259 | 11/1974 | Duncan et al. | 204/129.3 |
| 3,902,979 | 9/1975 | Thomas | 204/129.3 |

FOREIGN PATENT DOCUMENTS

543098 11/1973 Switzerland .

Primary Examiner—T. Tung
Attorney, Agent, or Firm—Robert J. Haase

[57] ABSTRACT

Electrically active defects, i.e., current-carrying defects or leakage paths in silicon crystals, are detected by an anodization process. The process selectively etches the crystal surface only where the electrically active defects are located when the anodization parameters are properly selected. Selected surface portions of the silicon structure are exposed to a hydrofluoric acid solution which is maintained at a negative potential with respect to the silicon structure. When the potential difference is set to a proper value, etch pits are formed in the surface of the silicon only at those locations overlying electrically active defects which impact device yield. The defects are observed and counted to provide a basis to predict yield of desired semi-conductor devices to be formed later in the silicon structure.

4 Claims, 3 Drawing Figures

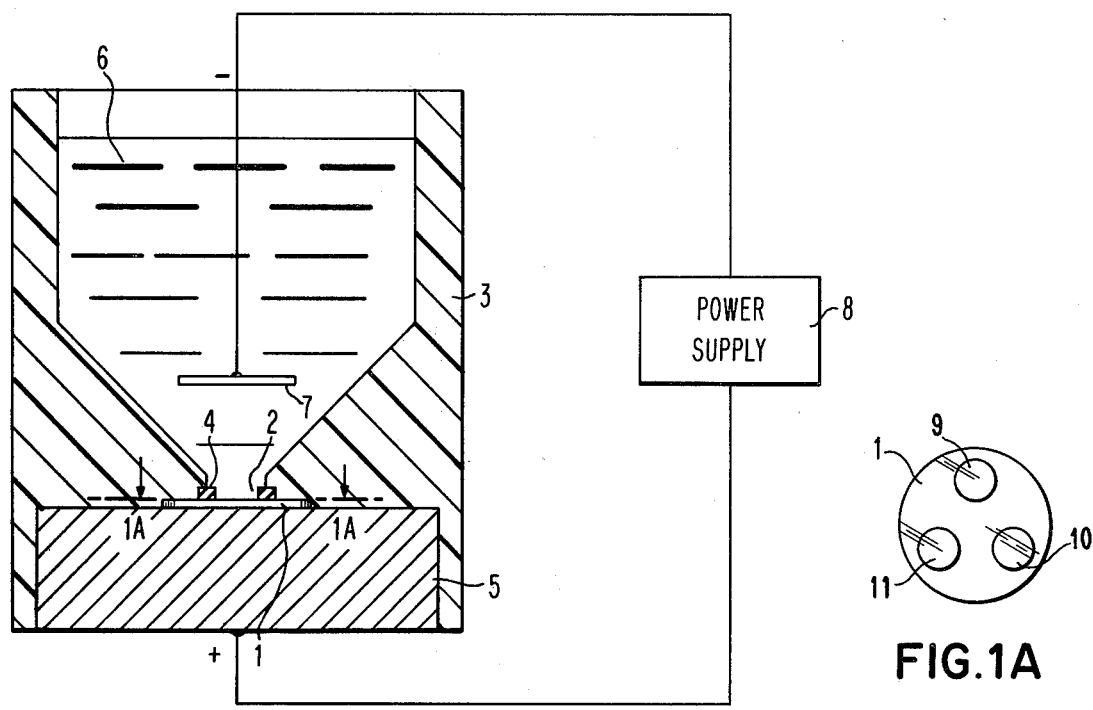
FIG.1
FIG.1A
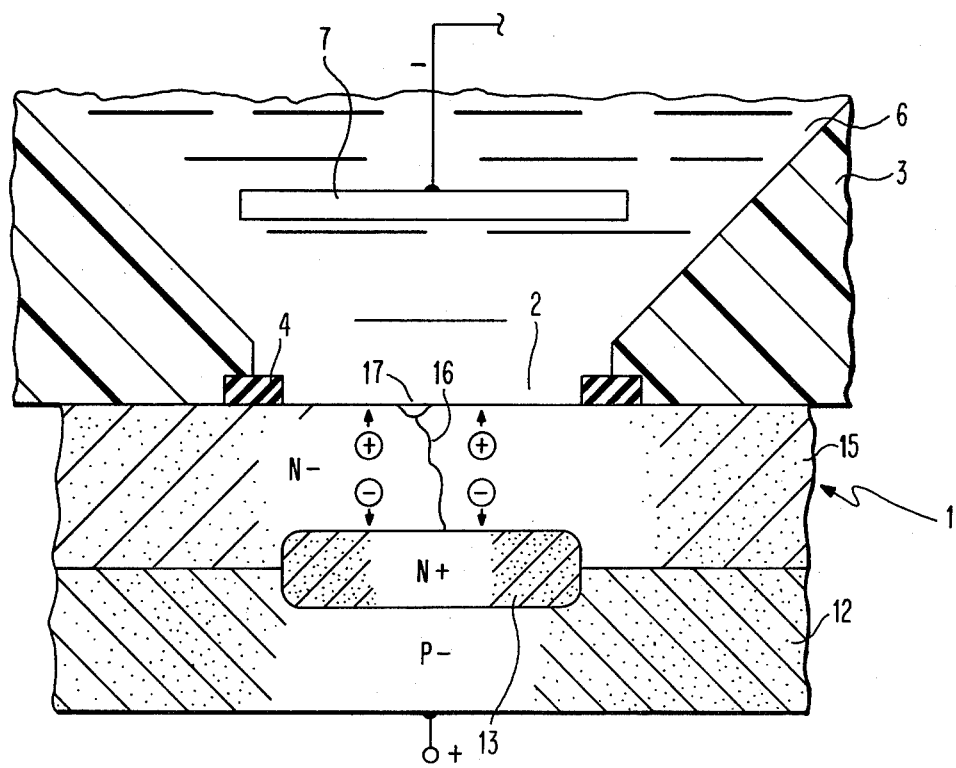
FIG.2

ANODIC ETCHING METHOD FOR THE DETECTION OF ELECTRICALLY ACTIVE DEFECTS IN SILICON

This is a continuation of application Ser. No. 667,232 filed Mar. 15, 1976, now abandoned.

BACKGROUND OF THE INVENTION

Yield is a measure of the success of a semiconductor device processing sequence in producing quality finished chips or wafers which are acceptable for their intended uses. It is known that yield is adversely effected by the occurrences of certain defects which can be introduced at various stages of the device processing sequence. Clearly, it is advantageous to detect such occurrences at the earliest possible time so that costly but futile additional processing steps normally required to complete the devices are not undertaken. More particularly, it has been found that the defect count is a reliable predictor of yield of devices which are later formed in the semiconductor material provided that the count is limited to those defects which are electrically active, i.e., current carrying defects or leakage paths which can result in shorted junctions or emitter-to-collector shorts, for example. Defects which are not electrically active are inconsequential to the performance of later formed devices and, therefore, are not to be included in the defect count.

SUMMARY OF THE INVENTION

Electrically active defects are detected in N type silicon substrates and epitaxial layers by the anodic etching of the semiconductor material exposed to a hydrofluoric acid solution. In order to enhance the visual discrimination between electrically active defects and nonelectrically active defects (which do not affect device yield), it is preferable that the concentration of the HF solution employed be less than about 15% and that the potential difference between the solution and the semiconductor material be set so that the depth of the resulting depletion layer below the surface of the semiconductor material in contact with the solution is commensurate with the depth of the active device region in the semiconductor material. Higher concentrations of HF tend to initiate an unwanted relatively low level of uniform anodic etching of the entire exposed surface of the semiconductor material with the result that the etch pits denoting the electrically active defects are less clearly distinguishable by visual inspection than in the case where no background etching is produced. Higher potential differences cause unwanted etch pits to appear denoting the presence of inconsequential electrically active defects lying below the active device region. The defect count is a reliable predictor of the yield of satisfactory semiconductor devices which are later formed in the semiconductor material.

BRIEF DESCRIPTION OF THE DRAWING

FIG. 1 is a diagramatic sketch of the apparatus employed in the performance of the method of the present invention;

FIG. 1A is a plan view of the silicon wafer shown in cross-section in FIG. 1; and FIG. 2 is an out-of-scale enlargement of a portion of the silicon wafer of FIG. 1.

DESCRIPTION OF THE PREFERRED EMBODIMENT

Referring to FIG. 1, semiconductor wafer 1 is sealed to the opening 2 of synthetic resin polymer cup 3 by O ring 4. Wafer 1 is supported against O ring 4 by stainless steel fixture 5. Cup 3 is filled with HF electrolyte 6 in which is immersed platinum foil 7. Power supply 8 provides a potential difference which is applied between foil 7 and fixture 5, making foil 7 negative with respect to fixture 5. Only the surface portion of wafer 1 interior to O ring 4 is contacted by electrolyte 6. Different surface portions of wafer 1 may be exposed at different times to electrolyte 6 in order to obtain defect data across the face of the wafer. As indicated in FIG. 1A, three separated surface regions 9, 10, and 11 are anodically etched at successive times. Alternatively, the entire wafer may be anodically etched at one time by increasing the size of the opening 2 of cup 3. The number of and sizes of the etched surface areas of wafer 1 is not a critical aspect of the present invention.

Examining semiconductor wafer 1 in more detail with the aid of FIG. 2, wafer 1 comprises a $P^-$ substrate 12 into which $N^+$ subcollector 13 is diffused. $N^-$ epitaxial layer 15 is deposited over the surface of substrate 12 under conditions which permit subcollector 13 to diffuse partially into it.

Electrically active defect 16 extends from subcollector 13 to the surface of epitaxial layer 15 which is in contact with electrolyte 6. Defect 16 is typical of those which adversely effect device yield in that defect 16 will present a conductive pathway from the collector through a $P^+$ base region to the emitter of a transistor (not shown) which is later formed in the epitaxial layer above subcollector 13 by subsequent processing steps. Electrically active defect 16 acts as a source of holes in N type epitaxial layer 15. Said holes migrate toward the overlying surface of epitaxial layer 15 under the influence of the electric field extending across the depletion region generated within epitaxial layer 15 by the potential difference applied between electrolyte 6 and substrate 12. As a result of the migration of the holes to the surface of epitaxial layer 15 and into contact with electrolyte 6, a pit 17 is etched into the surface of epitaxial layer 15 directly over the location of defect 16. There being no significant source of holes elsewhere within N type epitaxial layer 15 except at the sites of defects such as defect 16, there is no other silicon erosion.

Anodic processing of silicon wafers in HF solutions has been employed previously to form porous silicon for device isolation, for electro polishing, and for wafer thinning. Such applications, in common with the defect detection method of the present invention, involve the dissolution of silicon by an electro chemical reaction which requires the presence or introduction of holes. It is believed that the initiation of silicon dissolution is hole ($e^+$) dependent in accordance with the expression $Si + 2HF + (2-n)e^+ \rightarrow SiF_2 + 2H^+ + ne^-$ where $n < 2$.

In N type silicon where holes are minority carriers, enhanced electro chemical etching will occur wherever holes are injected. Electrically active defect sites act as recombination-generation centers in the N type silicon and provide this hole injection on a localized basis to produce the etch pit, such as pit 17, discussed above. Such etch pits are most easily seen when the concentration of the HF in the electrolyte solution 6 is less than about 15%. Concentrations of about 5% are preferred. Evidence has been obtained that the etch pits denoting the presence of electrically active defects are less clearly distinguished by visual examination when the concentration of the HF is increased above about 15%. It is believed that such increased concentrations of HF initiate anodic etching of the silicon surface in accordance with the above-described electro chemical reaction in the presence of randomly distributed hole sources at the surface of wafer 1 due to unwanted impurities, surface states, dangling bonds, excessive surface illumination, and the like. The last-named silicon surface conditions, in the presence of increased HF concentrations, cause the appearance of a surface "haze" due to a low level anodic etching reaction which tends to obscure the presence of the etch pits designating the presence of the electrically active defects which are of interest in accordance with the present invention. However, when the HF concentration of the electrolyte solution 6 is set below about 15% the surface "haze" effect is minimized or eliminated.

It can be seen that not all electrically active defects are of consequence in terms of device yield. Those electrically active defects which lie below the active device region in the silicon wafer in most cases will not adversely effect the performance of the semiconductor devices (bipolar transistors, etc.) which are later formed in the active device region of the wafer. In accordance with the method of the present invention, etch pits are avoided with respect to electrically active defects lying below the active device region of the wafer by setting the amplitude of the potential applied between the electrolyte 6 and the wafer 1 so that the depth of the depletion region produced within wafer 1 is commensurate with the depth of the active device region, i.e., the depth of the collector-base junction of the vertical bipolar transistors to be formed in wafer 1. Consequently, electrically active defects lying below the base region in epitaxial layer 15 within substrate 12 lie below the depletion region so that any holes injected thereby experience no significant electric field and are not driven to the surface of epitaxial layer 15. In the absence of holes at the surface of epitaxial layer 15, no etch pits are developed corresponding to electrically active defects lying below the active device region of the silicon wafer which is the desired result.

Upon the completion of the anodic etching method of the present invention, wafer 1 is removed from the apparatus of FIG. 1 and visually examined by any convenient technique such as microscope inspection, infrared TV camera and monitor, etc. The presence of one or more etch pits within a known critical surface area of wafer 1 is a reliable predictor that any device later formed within that critical area will be unacceptable. Alternatively, the number of etch pits per square surface area has been found to correlate closely with device yield. The anodically etched wafer surface areas may be predetermined portions of actual product wafers or the anodic etching may be done on test wafers which had been subjected to the same processing steps as the product wafers. In either event, the appearance of etch pits in critical wafer surface areas or in excess of an allowable surface area density (count) reliably establishes that the wafers tested and all those which are untested but fabricated with the same process steps as the tested wafers will not yield good devices. Accordingly, those further costly but futile manufacturing steps ordinarily required to complete the desired devices in the tested wafers are not undertaken thus minimizing the fabrication investment in material that in any event would be scrapped eventually.

While the invention has been particularly shown and described with reference to the preferred embodiment thereof, it will be understood by those skilled in the art that various changes in form and details may be made therein without departing from the spirit and scope of the invention.

What is claimed is:
1. The method comprising
   providing an $N^-$ type silicon wafer containing active device regions of known depth below a surface of said wafer,
   mounting said wafer on an electrically conductive member so as to expose said surface of said wafer, and to cover the entire opposite surface of said wafer,
   contacting said surface of said wafer with a hydrofluoric acid solution of concentration less than about 15%,
   applying a potential difference between said solution and said member making said solution negative with respect to said member, and
   setting the amplitude of said potential difference solely in accordance with the desired depth of the depletion region created thereby so that said depletion region is created below said surface of said wafer having a depth no greater than said depth of said active device regions, whereby etch pits are formed in said surface of said wafer overlying electrically active defects within said active device regions.

2. The method defined in claim 1 wherein said concentration is about 5%.

3. The method defined in claim 1 wherein a vertical bipolar transistor is formed in said silicon material and said depth of said depletion layer is commensurate with the depth of the collector-base junction of said transistor.

4. The method defined in claim 1 wherein said solution contacts only a portion of said surface of said wafer.

* * * * *